United States Patent
Cooper et al.

(10) Patent No.: US 10,038,854 B1
(45) Date of Patent: Jul. 31, 2018

(54) IMAGING-BASED TACTILE SENSOR WITH MULTI-LENS ARRAY

(71) Applicant: X Development LLC, Mountain View, CA (US)

(72) Inventors: Emily Cooper, Mountain View, CA (US); Xiaoyu Miao, Palo Alto, CA (US)

(73) Assignee: X Development LLC, Mountain View, CA (US)

( * ) Notice: Subject to any disclaimer, the term of this patent is extended or adjusted under 35 U.S.C. 154(b) by 212 days.

(21) Appl. No.: 14/924,687

(22) Filed: Oct. 27, 2015

Related U.S. Application Data

(60) Provisional application No. 62/205,405, filed on Aug. 14, 2015.

(51) Int. Cl.
  *B25J 13/08* (2006.01)
  *H04N 5/235* (2006.01)
  *G08B 6/00* (2006.01)
  *H04N 5/225* (2006.01)

(52) U.S. Cl.
  CPC .......... *H04N 5/2354* (2013.01); *B25J 13/084* (2013.01); *G08B 6/00* (2013.01); *H04N 5/2254* (2013.01)

(58) Field of Classification Search
  CPC ... H04N 5/2354; H04N 5/2254; B25J 13/084; G08B 6/00
  USPC ........................................................ 348/135
  See application file for complete search history.

(56) References Cited

U.S. PATENT DOCUMENTS

| | | | |
|---|---|---|---|
| 7,773,143 B2* | 8/2010 | Feldman | H04N 5/349 348/272 |
| 8,411,140 B2 | 4/2013 | Adelson | |
| 8,514,491 B2* | 8/2013 | Duparre | H01L 27/14621 359/443 |
| 8,905,610 B2 | 12/2014 | Coleman et al. | |
| 8,956,303 B2 | 2/2015 | Hong et al. | |
| 9,127,938 B2* | 9/2015 | Adelson | A61B 5/0077 |

(Continued)

OTHER PUBLICATIONS

Sato et al., Measurement of Force Vector Field of Robotic Finger using Vision-based Haptic Sensor, 2008, IEEE, pp. 488-493.*

(Continued)

*Primary Examiner* — Christopher S Kelley
*Assistant Examiner* — Kathleen Walsh
(74) *Attorney, Agent, or Firm* — McDonnell Boehnen Hulbert & Berghoff LLP

(57) ABSTRACT

An example device for reducing the size and color cross-talk of an imaging-based tactile sensor includes an elastic material, one or more light sources, and an image capture device. The elastic material includes a reflective membrane. The reflective membrane conforms to a shape of an object pressed against the elastic material. Each light source of the one or more light sources is configured to illuminate at least a portion of the reflective membrane. The image capture device is configured to capture at least one image of the reflective membrane. The image capture device includes (i) an image sensor configured to generate the at least one image based on light incident on the image sensor and (ii) a plurality of lenses configured to direct light onto the image sensor. Each lens of the plurality of lenses is configured to direct light onto a corresponding portion of the image sensor.

20 Claims, 8 Drawing Sheets

(56) References Cited

U.S. PATENT DOCUMENTS

| | | | | | |
|---|---|---|---|---|---|
| 2009/0315989 | A1* | 12/2009 | Adelson | ............... | A61B 5/1172 348/135 |
| 2010/0149183 | A1* | 6/2010 | Loewke | ............ | G06K 9/00134 345/424 |
| 2013/0038689 | A1* | 2/2013 | McDowall | ......... | G02B 27/0075 348/45 |
| 2013/0041216 | A1* | 2/2013 | McDowall | ............... | G02B 5/04 600/109 |
| 2013/0041235 | A1 | 2/2013 | Rogers et al. | | |
| 2013/0181114 | A1* | 7/2013 | Egawa | .............. | H01L 27/14629 250/208.1 |
| 2014/0104395 | A1* | 4/2014 | Rohaly | ............... | G01B 11/165 348/47 |
| 2014/0267762 | A1* | 9/2014 | Mullis | .................... | H04N 9/093 348/164 |
| 2015/0011894 | A1* | 1/2015 | Sarrafzadeh | ......... | A61B 5/0077 600/476 |
| 2015/0268450 | A1* | 9/2015 | Ueno | ................. | G02B 13/0015 348/360 |

OTHER PUBLICATIONS

Johnson, et al., "Microgeometry Capture Using an Elastomeric Sensor", Massachusetts Institute of Technology, 8 pages.

Johnson et al., "Retrographic Sensing for the Measurement of Surface Texture and Shape", 8 pages.

Li et al., "Localization and Manipulation of Small Parts Using GelSight Tactile Sensing", Institute of Electrical and Electronics Engineers (IEEE), Jun. 8, 2015, 7 pages.

Sato, et al., "Measurement of Force Vector Field of Robotic Finger Using Vision-Based Haptic Sensor", RSJ International Conference on Intelligent Robots and Systems, 2008 IEEE, Sep. 22-26, 2008, pp. 488-493.

Hristu, et al., "The Performance of a Deformable-Membrane Tactile Sensor: Basic Results on Geometrically-Defined Tasks", 2000 IEEE Int'l Conference on Robotics and Automation, 6 pages.

Yuji, et al., "Acquisition of Contact Force and Slippage Using a Vision-Based Tacticle Sensor With a Fluid-Type Touchpad for the Dexterous Handling of Robots", Journal Advances in Robotics & Automation, 2014, vol. 3, Issue 1, pp. 1-9.

* cited by examiner

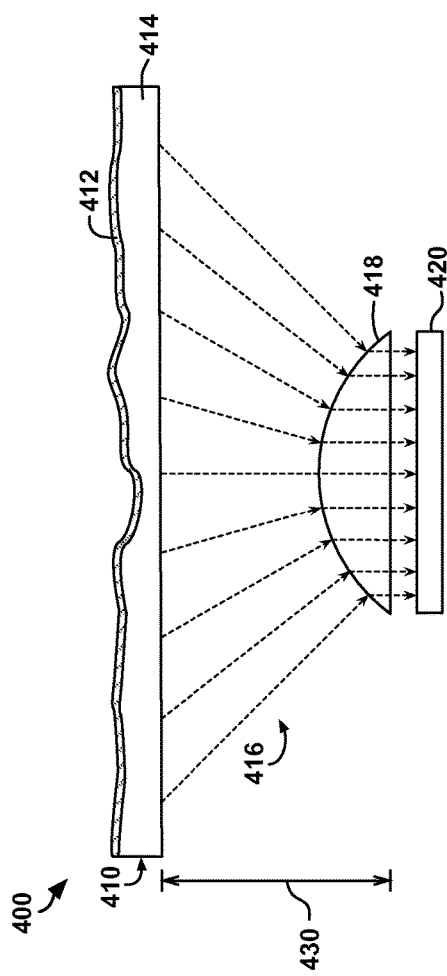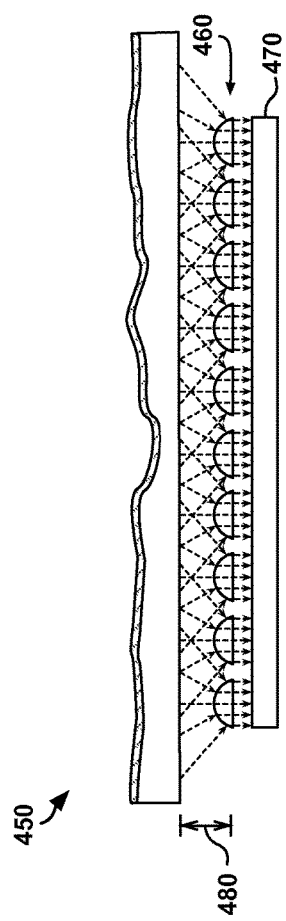
Figure 4A
Figure 4B

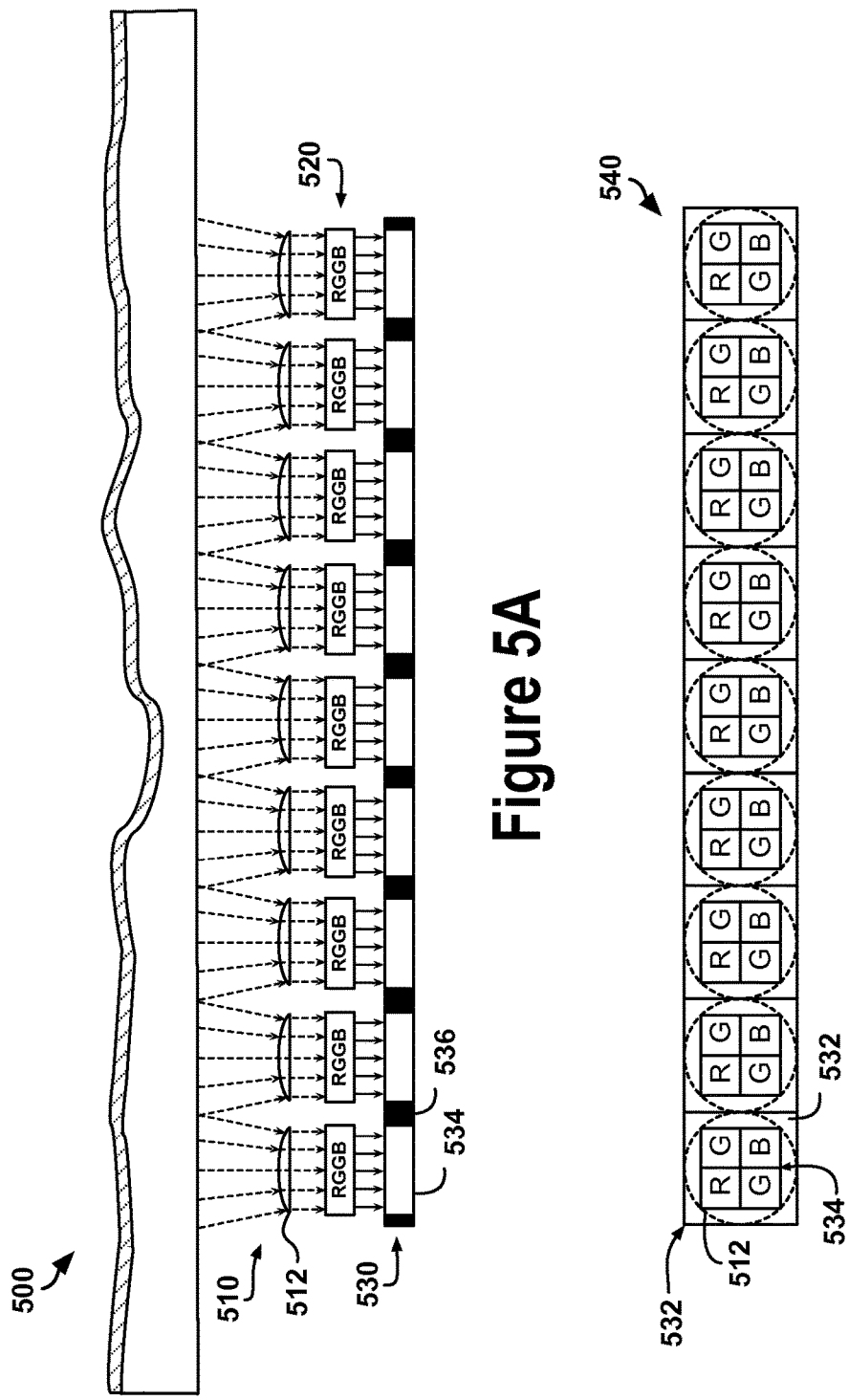

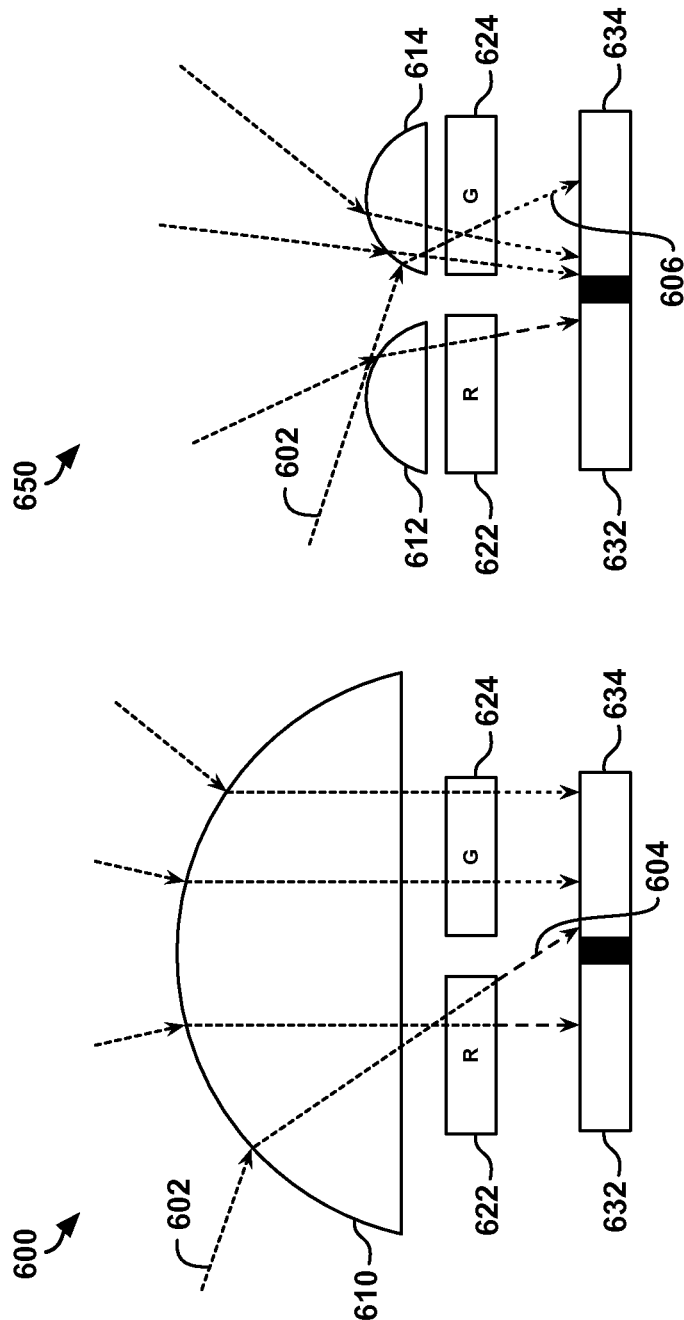

IMAGING-BASED TACTILE SENSOR WITH MULTI-LENS ARRAY

CROSS-REFERENCE TO RELATED APPLICATIONS

This application claims priority to U.S. Provisional Patent Application Ser. No. 62/205,405 filed on Aug. 14, 2015, the contents of which is incorporated herein by reference in its entirety.

BACKGROUND

As technology advances, various types of robotic devices are being created for performing a variety of functions that may assist users. Robotic devices may be used for applications involving material handling, transportation, welding, assembly, and dispensing, among others. Over time, the manner in which these robotic systems operate is becoming more intelligent, efficient, and intuitive. As robotic systems become increasingly prevalent in numerous aspects of modern life, it is desirable for robotic systems to be efficient. Therefore, a demand for efficient robotic systems has helped open up a field of innovation in actuators, movement, sensing techniques, as well as component design and assembly.

SUMMARY

The present application discloses implementations that relate to imaging-based tactile sensors with multi-lens arrays. In one example, the present application describes a device. The device includes an elastic material, one or more light sources, and an image capture device. The elastic material includes a reflective membrane. The reflective membrane conforms to a shape of an object pressed against the elastic material. The one or more light sources is situated proximate to the reflective membrane. Each light source of the one or more light sources is configured to illuminate at least a portion of the reflective membrane. The image capture device is configured to capture at least one image of the reflective membrane. The image capture device includes (i) an image sensor configured to generate the at least one image based on light incident on the image sensor and (ii) a plurality of lenses configured to direct light onto the image sensor. Each lens of the plurality of lenses is configured to direct light onto a corresponding portion of the image sensor.

In another example, the present application describes a tactile sensor. The tactile sensor includes an elastic material, a plurality of light sources, and an image capture device. The elastic material includes a reflective membrane. The reflective membrane conforms to a shape of an object pressed against the elastic material. The plurality of light sources is situated proximate to the reflective membrane. Each light source of the plurality of light sources is configured to illuminate at least a portion of the reflective membrane. The image capture device is configured to capture at least one image of the reflective membrane. The image capture device includes an image sensor configured to generate a plurality of sub-images based on light incident on the image sensor. The image capture device also includes a plurality of lenses configured to direct light onto the image sensor. Each lens of the plurality of lenses is configured to direct light onto a corresponding portion of the image sensor to generate a corresponding sub-image. The image capture device further includes processing hardware configured to combine the plurality of sub-images to form the at least one image of the reflective membrane.

In yet another example, the present application describes a robotic system. The robotic system includes a robotic manipulator and a tactile sensor. The robotic manipulator includes an end effector. The tactile sensor is coupled to the end effector. The tactile sensor includes an elastic material, one or more light sources, and an image capture device. The elastic material includes a reflective membrane. The reflective membrane conforms to a shape of an object pressed against the elastic material. The one or more light sources is situated proximate to the reflective membrane. Each light source of the one or more light sources is configured to illuminate at least a portion of the reflective membrane. The image capture device is configured to capture at least one image of the reflective membrane. The image capture device includes (i) an image sensor configured to generate the at least one image based on light incident on the image sensor and (ii) a plurality of lenses configured to direct light onto the image sensor. Each lens of the plurality of lenses is configured to direct light onto a corresponding portion of the image sensor.

The foregoing summary is illustrative only and is not intended to be in any way limiting. In addition to the illustrative aspects, embodiments, and features described above, further aspects, embodiments, and features will become apparent by reference to the figures and the following detailed description and the accompanying drawings.

BRIEF DESCRIPTION OF THE FIGURES

FIG. 4A illustrates a side view of a single-lens imaging-based tactile sensor, according to an example embodiment.

FIG. 4B illustrates a side view of a multi-lens imaging-based tactile sensor, according to an example embodiment.

FIG. 5A illustrates a side view of a multi-lens imaging-based tactile sensor, according to an example embodiment.

FIG. 5B illustrates a top-down view of an image sensor, according to an example embodiment.

FIG. 6A is a conceptual illustration of color cross-talk in a single-lens imaging-based tactile sensor, according to an example embodiment.

FIG. 6B is a conceptual illustration of reduced color cross-talk in a multi-lens imaging-based tactile sensor, according to an example embodiment.

DETAILED DESCRIPTION

Figure 1:
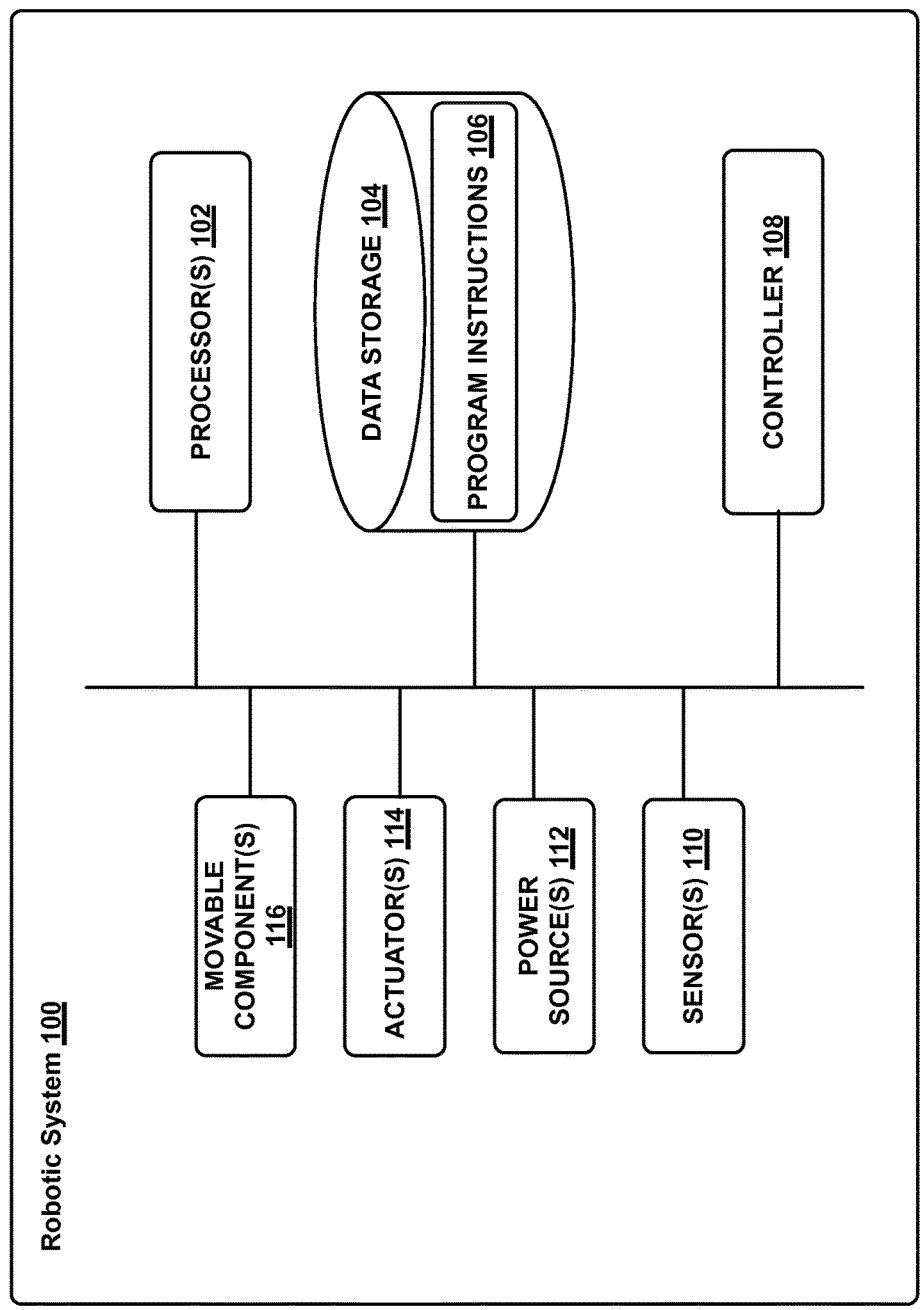
FIG. 1 illustrates an example configuration of a robotic system, according to an example embodiment.

The following detailed description describes various features and operations of the disclosed systems and methods with reference to the accompanying figures. The illustrative system and method embodiments described herein are not meant to be limiting. It may be readily understood that certain aspects of the disclosed systems and methods can be arranged and combined in a wide variety of different configurations, all of which are contemplated herein.

I. Overview

The present application discloses implementations that relate to imaging-based tactile sensors with multi-lens arrays. An example imaging-based tactile sensor includes an elastic material and a camera. When an object is pressed against a surface of elastic material, the elastic material conforms to the shape of that object. The surface of the elastic material may be coated with a reflective substance that accentuates the contours and shape of the object. The camera then captures one or more images of the impressed shape. Various processing techniques may then be applied to the captured images to determine information about the object, such as its geometry, shape, orientation, and other features of the object.

In some applications a highly sensitive tactile sensor capable of detecting fine details on the surface of an object may be desired. One way to achieve higher sensitivity is to use a camera with a high resolution image sensor (e.g., an image sensor containing a large number of photodetectors or pixels). Generally, higher resolution image sensor is larger compared to lower resolution image sensors. As a result, many higher resolution cameras utilize a larger lens to direct light onto its image sensor. Additionally, the larger lens must be situated at a further distance from the high resolution image sensor. Thus, this technique of increasing the sensitivity of an imaging-based tactile sensor generally increases the dimensions of the overall sensor.

Large tactile sensors may have limited applications. For example, it may be desired to incorporate a tactile sensor within a compact form factor—such as a robotic finger—to allow the sensor to be used within small spaces. However, a single-lens tactile sensor capable of fitting within such small form factors may be low resolution and therefore lack the sensitivity of a larger sensor.

Single-lens imaging-based tactile sensors may also suffer from color cross-talk. Color cross-talk occurs when light refracted by the camera's lens becomes angled such that it passes through a particular color filter and onto an adjacent photodetector of the image sensor. For example, refracted light might be filtered by a red filter—a material that passes through light of wavelengths within a visible red light range—but lands on an adjacent photodetector beneath a green filter. In this example, the photodetector associated with the green filter may receive mostly light that passed through the green filter and some light that passed through the red filter. As a result, the charge generated by the photodetector may not purely represent the intensity of green light, although that charge was designed to represent green light information only.

In imaging-based tactile sensor applications, color cross-talk may lead to inaccuracies in the tactile sensor's depth sensing. Some imaging-based tactile sensors include colored light sources placed at known positions which illuminate the elastic material from different angles. The image sensor may capture an image for each color present within the color filter array. Using photometric stereo techniques, a depth map (or height map) of the surface of the object pressed against the elastic material may be determined. Thus, in color-based tactile depth sensing applications, inaccurate color information may lead to imprecise depth imaging.

An example embodiment of the present application involves positioning multiple lenses over the image sensor, each of which directs light onto different portions of the image sensor. One implementation of such a multi-lens imaging-based tactile sensor utilizes a planar array of lenses, such as a micro-lens array. Each lens within the array may be smaller in size compared to sensors utilizing a single, large lens. Additionally, the smaller lenses may be placed closer to the image sensor and/or the color filter array. The reduced lens size and its closer proximity to the image sensor allows the multi-lens tactile sensor to be smaller in size compared to a single-lens tactile sensor.

During operation, the image capture device may generate a set of sub-images—one for each lens—and combine or process the sub-images to form a complete image of the surface. In some implementations, each sub-image represents a unique field-of-view with respect to the other sub-images; in these implementations, the image capture device may stitch together the sub-images to form the full image. In other implementations, the field-of-view of each sub-image may overlap with the field-of-view of one or more other sub-images; in these implementations, some processing may be applied to transform, crop, or otherwise alter each sub-image in order to form the full image. Additionally, in overlapping field-of-view implementations, the image capture device may act as a plenoptic camera (i.e., a "light-field camera") to allow the tactile sensor to post-process the captured image to vary the image's depth of field after it has been captured.

Another example embodiment of the present application involves coupling photodetector sub-arrays to single color filters within a color filter array in order to reduce color cross-talk. A lens of the lens array may direct light onto a single color filter, which passes light of a certain color onto a group of photodetectors. Such a configuration may reduce color cross talk because adjacent photodetectors within a given group are associated with a common color. Thus, in these configurations, fewer color cross-talk boundaries are present, leading to improved color accuracy of the produced images.

Additionally, each group of photodetectors associated with a single color filter may be separated from adjacent groups of photodetectors by an empty space or with a non-photoactive material. In these embodiments, any color cross-talk that might occur near the photodetector group boundaries may be further reduced.

Note that "photodetector" and "pixel" may be used interchangeably herein to described an element of an image sensor that generates a charge proportionate to the intensity of light incident on the element. Some example photodetectors include the photoactive region of a charge-couple device (CCD) or a photodiode of a complementary metal-oxide-semiconductor (CMOS) sensor. A photodetector or a pixel may also incorporate other electrical elements, such as diodes, transistors, capacitors, and/or other semiconductor-based or electronic elements. As described herein, a photodetector or pixel of an image sensor may correspond to a pixel within an image captured by the image sensor.

For the purposes of this application, an "array" may generally refer to a two-dimensional arrangement of elements. One example arrangement of an array is a planar array, where elements are arranged in a rectangular grid. The elements in an array may be arranged in a variety of other ways not explicitly contemplated herein.

The multi-lens imaging-based tactile sensors described herein may be used in a variety of applications. For example, they may be incorporated within a robotic finger or appendage to improve its dexterity and sensory capabilities. A robot may be controlled or instructed to perform a delicate task that requires it to use its fingers to grip an object. The highly sensitive and compact tactile sensors of the present application may be used to enable the robot to detect a gripped object's shape, orientation, and where on the object the robot is gripping the object. Using this information, the robot may be able to perform precise maneuvers to accomplish a desired task, such as handling small objects in tight spaces, connecting objects together, or assembly of small materials such as electronics or mechanical devices. Other applications include structural testing, package handling, and other metrology systems.

II. Example Robotic Systems

FIG. 1 illustrates an example configuration of a robotic system that may be used in connection with the implementations described herein. The robotic system 100 may be a robotic arm, a different type of robotic manipulator, or it may have a number of different forms. Additionally, the robotic system 100 may also be referred to as a robotic device, robotic manipulator, or robot, among others.

The robotic system 100 is shown to include processor(s) 102, data storage 104, program instructions 106, controller 108, sensor(s) 110, power source(s) 112, actuator(s) 114, and movable component(s) 116. Note that the robotic system 100 is shown for illustration purposes only as robotic system 100 may include additional components and/or have one or more components removed without departing from the scope of the invention. Further, note that the various components of robotic system 100 may be connected in any manner.

Processor(s) 102 may be a general-purpose processor or a special purpose processor (e.g., digital signal processors, application specific integrated circuits, etc.). The processor(s) 102 can be configured to execute computer-readable program instructions 106 that are stored in the data storage 104 and are executable to provide the functionality of the robotic system 100 described herein. For instance, the program instructions 106 may be executable to provide functionality of controller 108, where the controller 108 may be configured to instruct an actuator 114 to cause movement of one or more movable component(s) 116.

The data storage 104 may include or take the form of one or more computer-readable storage media that can be read or accessed by processor(s) 102. The one or more computer-readable storage media can include volatile and/or non-volatile storage components, such as optical, magnetic, organic or other memory or disc storage, which can be integrated in whole or in part with processor(s) 102. In some embodiments, the data storage 104 can be implemented using a single physical device (e.g., one optical, magnetic, organic or other memory or disc storage unit), while in other embodiments, the data storage 104 can be implemented using two or more physical devices. Further, in addition to the computer-readable program instructions 106, the data storage 104 may include additional data such as diagnostic data, among other possibilities.

The robotic system 100 may include one or more sensor(s) 110 such as force sensors, proximity sensors, motion sensors, load sensors, position sensors, touch sensors, depth sensors, ultrasonic range sensors, and infrared sensors, among other possibilities. The sensor(s) 110 may provide sensor data to the processor(s) 102 to allow for appropriate interaction of the robotic system 100 with the environment. Additionally, the sensor data may be used in evaluation of various factors for providing feedback as further discussed below. Further, the robotic system 100 may also include one or more power source(s) 112 configured to supply power to various components of the robotic system 100. Any type of power source may be used such as, for example, a gasoline engine or a battery.

The robotic system 100 may also include one or more actuator(s) 114. An actuator is a mechanism that may be used to introduce mechanical motion. In particular, an actuator may be configured to convert stored energy into movement of one or more components. Various mechanisms may be used to power an actuator. For instance, actuators may be powered by chemicals, compressed air, or electricity, among other possibilities. In some cases, an actuator may be a rotary actuator that may be used in systems involving rotational forms of motion (e.g., a joint in the robotic system 100). In other cases, an actuator may be a linear actuator that may be used in systems involving straight line motion.

In either case, actuator(s) 114 may cause movement of various movable component(s) 116 of the robotic system 100. The moveable component(s) 116 may include appendages such as robotic arms, legs, and/or hands, among others. The moveable component(s) 116 may also include a movable base, wheels, and/or end effectors, among others.

In some implementations, a computing system (not shown) may be coupled to the robotic system 100 and may be configured to receive input from a user, such as via a graphical user interface. This computing system may be incorporated within the robotic system 100 or may be an external computing system that is capable of (wired or wireless) communication with the robotic system 100. As such, the robotic system 100 may receive information and instructions, such as based on user-input at the graphical user interface and/or based on user-input received via press of buttons (or tactile input) on the robotic system 100, among other possibilities.

Figure 2:
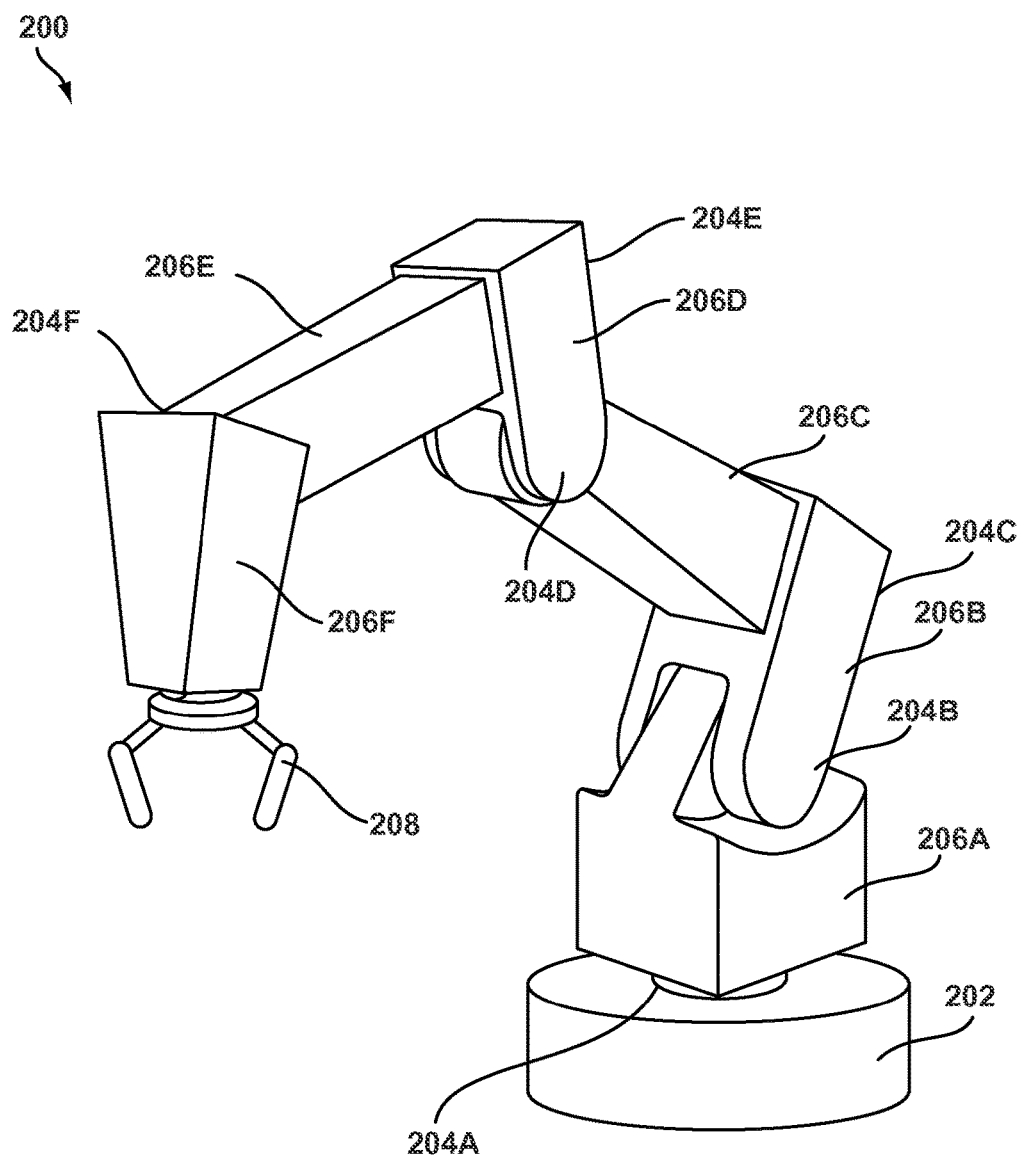
FIG. 2 illustrates an example robotic arm, according to an example embodiment.

A robotic system 100 may take on various forms. To illustrate, FIG. 2 shows an example robotic arm 200. As shown, the robotic arm 200 includes a base 202, which may be a stationary base or may be a movable base. In the case of a movable base, the base 202 may be considered as one of the movable component(s) 116 and may include wheels (not shown), powered by one or more of the actuator(s) 114, which allow for mobility of the entire robotic arm 200.

Additionally, the robotic arm 200 includes joints 204A-204F each coupled to one or more of the actuator(s) 114. The actuators in joints 204A-204F may operate to cause movement of various movable component(s) 116 such as appendages 206A-206F and/or end effector 208. For example, the actuator in joint 204F may cause movement of appendage 206F and end effector 208 (i.e., since end effector 208 is coupled to appendage 206F). Further, end effector 208 may take on various forms and may include various parts. In one example, end effector 208 may take the form of a gripper such as a finger gripper as shown here or a different type of gripper such as a suction gripper. In another example, end effector 208 may take the form of a tool such as a drill or a brush. In yet another example, the end effector may include sensors such as force sensors, location sensors, and/or proximity sensors. Other examples may also be possible.

In an example implementation, a robotic system 100, such as robotic arm 200, may be capable of operating in a teach mode. In particular, teach mode may be an operating mode of the robotic arm 200 that allows a user to physically interact with and guide the robotic arm 200 towards carrying out and recording various movements. In a teaching mode, an external force is applied (e.g., by the user) to the robotic system 100 based on a teaching input that is intended to teach the robotic system regarding how to carry out a specific task. The robotic arm 200 may thus obtain data regarding how to carry out the specific task based on instructions and guidance from the user. Such data may relate to a plurality of configurations of the movable component(s) 116, joint position data, velocity data, acceleration data, torque data, force data, and power data, among other possibilities.

For example, during teach mode the user may grasp onto any part of the robotic arm 200 and provide an external force by physically moving the robotic arm 200. In particular, the user may guide the robotic arm 200 towards grasping onto an object and then moving the object from a first location to a second location. As the user guides the robotic arm 200 during teach mode, the system may obtain and record data related to the movement such that the robotic arm 200 may be configured to independently carry out the task at a future time during independent operation (e.g., when the robotic arm 200 operates independently outside of teach mode). Note, however, that external forces may also be applied by other entities in the physical workspace such as by other objects, machines, and/or robotic systems, among other possibilities.

Figure 3:
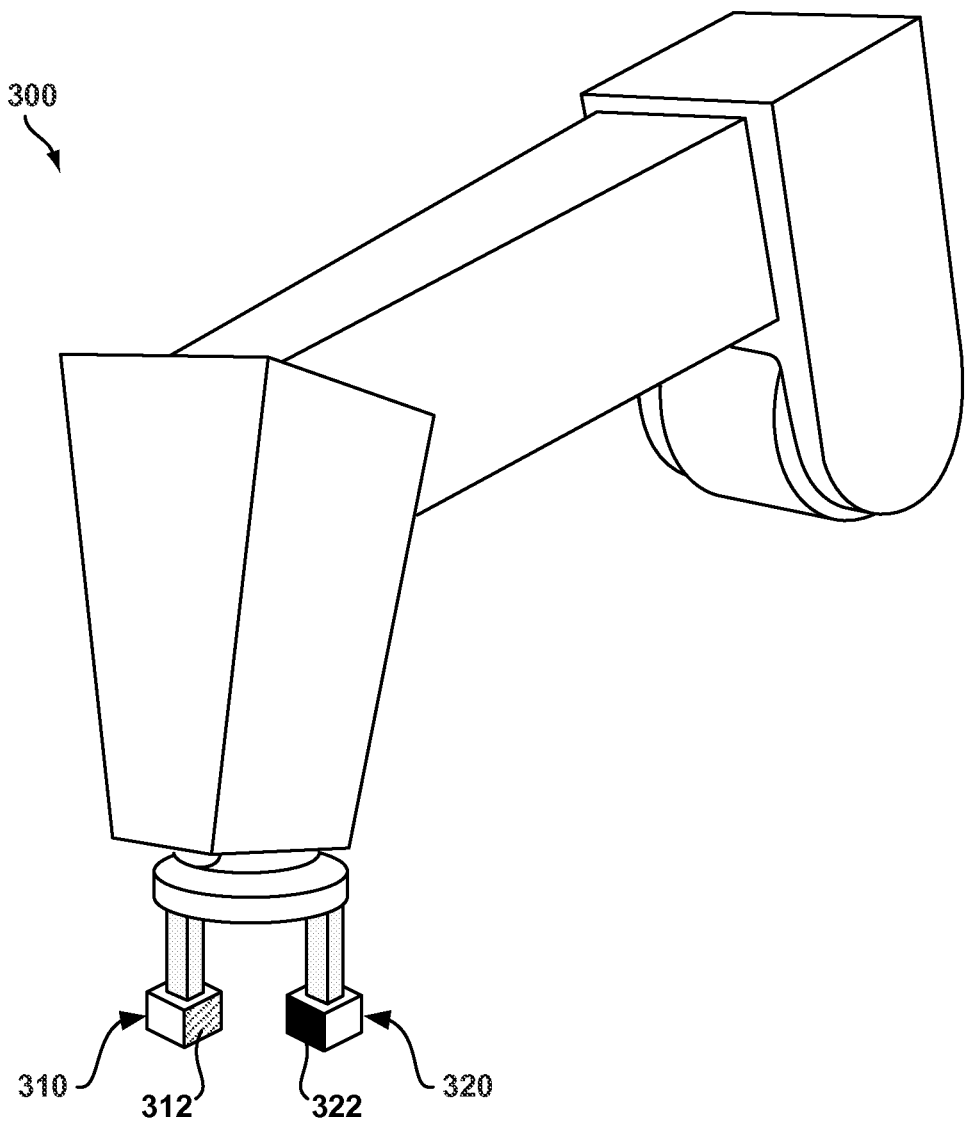
FIG. 3 illustrates an example robotic arm with a tactile sensor, according to an example embodiment.

FIG. 3 illustrates an example robotic arm 300 with an end effector that includes a tactile sensor. More specifically, the end effector includes two robotic fingers—robotic finger 310 and robotic finger 320. The robotic finger 310 may include elements of a tactile sensor as described herein, including an elastic material 312. The robotic finger 320 may include a gripping platform 322 that serves as a base against which an object is gripped.

During operation, the robotic arm 300 may position an object between robotic finger 310 and robotic finger 320. Then, the robotic arm 300 may move the robotic finger 310 and/or the robotic finger 320 in order to bring them closer together to grip the object. The object may be pressed against the gripping platform 322 by the elastic material 312. As the object is pressed against the elastic material 312, its shape may be impressed into the elastic material 312, which may then be captured by the tactile sensor incorporated within the robotic finger 310.

Note that the shape, size, and relative positioning of the robotic finger 310 and the robotic finger 320 may differ, depending upon the particular implementation. The robotic arm 300 illustrates one example configuration of a robotic arm that includes a tactile sensor.

III. Example Size Reduction Using Array of Lenses

FIG. 4A illustrates a side view 400 of a single-lens imaging-based tactile sensor, according to an example embodiment. In this example, the single-lens tactile sensor includes an elastic material 410, a lens 418, and an image sensor 420. The elastic material 410 includes a reflective membrane 412 and a transparent volume 414. The reflective membrane 412 is shown in FIG. 4A to have conformed to the shape of an object (not shown in the figures).

Here, light reflecting off of the reflective membrane 412 passes through the transparent volume 414 and toward the lens 418. Light 416 incident on the surface of lens 418 is refracted and directed toward the image sensor 420. The image sensor 420 then receives the directed light and generates an image of the impressed shape of reflective membrane 412.

In order to capture light of the entire reflective membrane 412, the lens 418 is positioned at a distance based on the angle-of-view lens 418 and/or the focal length of lens 418. If the lens 418 is placed too closely to the reflective membrane 412, it may not direct light of the entire reflective membrane 412. Additionally, the lens 418 may have a focal length that requires it to be placed at a distance approximately equal to that focal length from the reflective membrane in order to clearly resolve features of the impressed object's shape. Based on the size, focal length, and angle-of-view of the lens 418, the lens 418 may be placed at a distance 430 from the elastic material.

The elastic material 410 may be any flexible or stretchable material that conforms to the shape of objects pressed against it. In some instances, the reflective membrane 412 and the transparent volume 414 may be composed of the same material. The reflective membrane 412 may be any elastomer having at least one side coated, painted, pigmented, or otherwise covered with a reflective material. In some implementations, the side of the reflective membrane facing the lens or lenses is the side covered in the reflective material. The reflective material may be opaque to minimize sensitivity to ambient lighting. The reflective material may be highly reflective, so as to emphasize the features of the impressed object's surface or substantially matte, which facilitates sensitivity to a wider range of surface deflection. The elastic material 410 may, for example, be a polymer such as silicone rubber, among other possible elastic materials.

In the single-lens example of FIG. 4A, other lenses, reflective devices, and/or refractive devices may be included in the tactile sensor and situated above or below the lens 418. For example, two or more lenses may be stacked vertically in order to focus light onto a small image sensor. For the purposes of this application, configurations where multiple lenses are used for this kind of refraction or are otherwise stacked vertically with respect to the image sensor 420 are considered "single-lens" implementations or examples, despite possibly having more than one lens. As described herein, "multi-lens" implementations refer to imaging-based tactile sensors whose lens arrangement allows the distance between the lenses and the elastic material to be reduced compared to "single-lens" implementations.

FIG. 4B illustrates a side view 450 of a multi-lens imaging-based tactile sensor, according to an example embodiment. Here, the elastic material and reflective membrane are the same as in FIG. 4A. However, instead of a single lens 418 directing light onto the image sensor 420, an array of lenses 460 collectively direct light onto the image sensor 470. The size of each lens of the array of lenses 460 is smaller than the single lens 418. In some instances, each lens of the array of lenses 460 may have a shorter focal length than the single lens 418.

In this example, each lens of the array of lenses 460 has the same angle-of-view as the single lens 418. However, because the array of lenses 460 are placed closer to the elastic material 410, each lens only directs a portion of light reflected from the reflective membrane 412. Accordingly, light directed onto the image sensor 470 from each lens of the array of lenses 460 is associated with a portion of the reflective membrane 412.

In some implementations, the image sensor 470 is configured to generate a set of sub-images each corresponding to a particular lens within the array of lenses 460. Processing hardware, a computing device, and/or other circuitry may then combine the sub-images to generate a full image of the reflective membrane.

Based on the size, focal length, and angle-of-view of each lens in the array of lenses 460, the array of lenses 460 may be placed at a distance 480 from the elastic material 410. As illustrated in FIGS. 4A and 4B, the distance 430 is greater than the distance 460. Thus, the tactile sensor utilizing the array of lenses 460 can be constructed to have smaller dimensions compared to the tactile sensor utilizing the single lens 418.

In some implementations, the array of lenses 460 may be a micro-lens array. A micro-lens array is an optical element that includes multiple lenses arranged in a two-dimensional planar array on a supporting substrate. The micro-lenses may be circular with some amount of separation between each lens and its adjacent lenses. In some cases, the micro-lenses may be touching or overlap. The micro-lenses may be arranged in a rectangular grid (where each micro-lens borders up to 4 adjacent micro-lenses), a hexagonal grid (where each micro-lens borders up to 6 adjacent micro-lenses), or other kinds of arrangements or combinations thereof.

The lenses in the array of lenses 460 may have diameters as large as a few centimeters and as small as a few micrometers. Additionally, the degree of concavity or convexity may vary, depending upon the particular implementation.

Further, the lenses within the array of lenses 460 may differ from one another. For example, a lens array may contain lenses of varying sizes and degrees of convexity, depending upon the color filter or filters that a given lens is configured to direct light onto.

Note that the multi-lens configuration shown in FIG. 4B is merely one example configuration of a multi-lens imaging-based tactile sensor. Other embodiments, implementations, or configurations may utilize a variety of lens arrangements, different spacing between adjacent lenses, different sized lenses, lenses with a different angle-of-view, and/or fewer or more lenses. Additionally, the array of lenses 460 may be placed closer to or farther from the elastic material, depending upon the particular implementation. Further, the array of lenses 460 may be placed closer to or further from the image sensor 460.

The tactile sensors described herein may operating according to a variety of sensing modes. In some embodiments, the sensor may generate a three-dimensional depth map of an object's surface based on two or more images of the impressed shape into the reflective membrane 412. The sensor may contain a set of light sources arranged to illuminate the reflective membrane 412 from different angles. In some implementations, the tactile sensor may operate each of the light sources in a timed sequence and capture an image during each illumination period. The tactile sensor or another processing device may use photometric stereoscopic techniques on the set of images—each of which represents the reflective membrane illuminated from a different angle—in order to determine the depth of the surface features impressed into the reflective membrane. In other implementations, the light sources may be different colors and illuminate the reflective membrane 412 simultaneously. In the multi-colored light source implementations, the tactile sensor may capture a color image of the reflective membrane and produce the depth map using photometric stereo techniques.

Note that, as referred to herein, "photometric stereo techniques" may generally refer to three-dimensional imaging techniques and/or other processes for determining depth or height information from one or more images. For the purposes of this application, an "image" may refer to data or information representative of a viewpoint at a particular point in time. A single "image" may include color information—such as respective red, green, and blue intensity values—which are captured simultaneously. Thus, determining depth information using color photometric stereo techniques may only require a single "image" from which two or more separate single-color sub-images are extracted, where each single-color sub-image may represent light incident from a particular angle or direction onto the reflective membrane. More generally, three-dimensional imaging techniques may utilize a means for determining two or more sub-images representing light incident from respective two or more directions based on a single image captured at a particular point in time.

In other embodiments, the tactile sensors described herein may additionally or alternatively estimate shear and normal forces of an object pressed against the reflective membrane. For example, a reflective membrane and/or another part of the elastic material may include a known pattern that deforms when an object is pressed against the elastic material. The tactile sensor may capture an image of deformed elastic material for determining the extent of deformation of the known pattern. Based on the displacement and/or transformation of this known pattern, shear and/or normal forces may be estimated. For example, if a portion of the pattern is depressed and moved closer to the image sensor, that portion of the pattern may appear to be larger than when it is not deformed. As another example, if a portion of the pattern is shifted from its non-deformed location, a shear force may be inferred or estimated by the tactile sensor at that location. This patterned elastic material embodiment may be calibrated in order to more accurately determine shear and/or normal force values.

Unlike depth-sensing modes, normal and/or shear force estimation modes may capture a single image of the elastic material and/or reflective membrane illuminated by a single light source or multiple light sources. By detecting the extent of deformation of the elastic material, various aspects of the object—such as its orientation and position—may be determined or inferred. Thus, normal and/or shear force-sensing tactile sensors may not necessarily incorporate light sources within the sensor. In some instances, light sources may be included within the sensor to illuminate the reflective membrane and/or elastic material, but the positions and angles of those light sources may not be known or considered in determining the normal and/or shear forces.

It should be understood that a given tactile sensor of the present application may incorporate one or more of the above-described sensing modes, depending upon the particular implementation. Further, a tactile sensor may include any combination of elements to achieve one or more of the various sensing modes described herein.

IV. Example Multi-Lens Imaging-Based Tactile Sensor Configuration

As referred to herein, a lens's "angle-of-view" refers to the angular range of light received at the lens. A lens's or image's "field-of-view" as described herein refers to the portion of the elastic material or reflective membrane received at the lens or captured within an image or sub-image. The angle-of-view of a lens is dependent upon its curvature. Highly convex lenses will have a wide angle-of-view, while flatter lenses will have a narrow angle-of-view. The field-of-view of a lens or image is dependent upon the lens's angle-of-view and the distance between the lens and the elastic material or reflective membrane. A lens situated far from the elastic material will have a large field-of-view, while lenses situated close to the elastic material will have a smaller field-of-view.

FIG. 5A illustrates a side view 500 of a multi-lens imaging-based tactile sensor, according to an example embodiment. The tactile sensor in FIG. 5A may be similar to the tactile sensor in FIG. 4B. However, whereas the field-of-view of each lens in the array of lenses 460 in FIG. 4B overlap, the field-of-view of each lens in the array of lenses 510 in FIG. 5A do not overlap. Here, each lens in the array of lenses 510 is less convex than the lenses in the array of lenses 460, and therefore have a comparatively narrower angle-of-view. As a result, the image sensor 530 generates a set of non-overlapping sub-images, unlike the image sensor 470 which generates a set of overlapping sub-images.

In this example configuration, each lens of the array of lenses 510 directs light onto a corresponding color filter sub-array of the color filter array 520. Each sub-array—labelled in FIG. 5A as "RGGB"—may contain one or more distinct color filters. In this example, each color filter sub-array is a Bayer filter having one red filter, two green filters, and one blue filter. Thus, light incident on a given lens is directed onto a color filter sub-array, which passes the filtered light onto a corresponding portion of the image sensor 530. The image sensor 530 may include groups of photodetectors (illustrated as white blocks beneath the color filter array 520) separated by non-photoactive regions (illustrated as black blocks separating each of the white blocks), such as non-photoactive region 532.

FIG. 5B illustrates a top-down view 540 of the image sensor 530, according to an example embodiment. In this example, each lens of the array of lenses 510 directs light onto a 2×2 sub-array of photodetectors of image sensor 530. The image sensor 530 includes multiple sections each corresponding to a lens of the array of lenses 510. An example section 532 includes a photodetector group 534 surrounded by a non-photoactive region 536, which collectively are situated beneath lens 512.

As illustrated in FIG. 5B, each photodetector of the photodetector group 534 is labelled with an "R," a "G," or a "B" indicative of the color of light passing through the corresponding color filter onto that particular photodetector. Thus, in the arrangement depicted in FIGS. 5A and 5B, full color RGB information is captured for each region of the reflective membrane.

In the configuration depicted in FIGS. 5A and 5B, the non-photoactive region may reduce color cross-talk in the image sensor. For instance, some light refracted by lens 512 may strike a color filter beneath the lens 512 at an angle such that the filtered light lands on a photodetector within the adjacent section of the image sensor 530. By separating each photodetector group with a non-photoactive region, these stray beams of filtered light may land on the non-photoactive region, thereby not "bleeding" over onto a photodetector of the adjacent group. As referred to herein, a non-photoactive region may be any material, substance, or space that does not affect images generated by an image sensor.

The color filter array 530 illustrated in FIGS. 5A and 5B is just one example color filter array that may be utilized in a multi-lens imaging-based tactile sensor. Other implementations may use a color filter sub-array of a single color, rather than a combination of color filters as depicted in FIGS. 5A and 5B. Any number of color filters within a color filter sub-array may filter light onto a corresponding sub-array of any number of photodetectors. For instance, a color filter sub-array may filter light onto a 4×4 or an 8×8 photodetector sub-array.

Although not illustrated in the figures, a multi-lens tactile sensor of the present application may include or be communicatively coupled to processing hardware, circuitry, and/or a computing device that acts as an image signal processor (ISP). The ISP may receive the charges generated by the photodetectors of an image sensor and produce an image based on those charges. The ISP may also perform color demosaicing to produce a full color image based on information from two or more separate single-color images. Additionally, the ISP may perform stitching of sub-images associated with each micro-lens in order to form a full image (e.g., form a mosaic of the sub-images). Further, the ISP may perform photometric stereo processing in order to generate a depth map (or height map) based on multiple single-color images.

Note that, as described herein, a color "filter" is a substance or material that absorbs or reflects light within one or more ranges of wavelengths and passes through light within one or more different ranges of wavelengths. For example, a green color filter may pass light within a range of wavelengths considered to be green visible light, while absorbing or reflecting light outside of the green visible light band (e.g., yellow light, orange light, red light, infrared light, blue light, violet light, ultraviolet light, etc.). Thus, a green color filter allows green visible light to pass through it and onto a corresponding one or more photodetectors.

V. Example Color Cross-Talk Reduction

FIG. 6A is a conceptual illustration 600 of color cross-talk in a single-lens imaging-based tactile sensor, according to an example embodiment. As described above, color cross-talk occurs when filtered light intended for one photodetector bleeds onto an adjacent photodetector. In this example, light beam 602 strikes the lens 610 at an angle, which refracts to form the angled light beam 604. The angled light beam 604 passes through the red filter 622, which blocks out blue light and green light in the angled light beam 604. The filtered and angled light beam 604 then exits the red filer 622 at such an angle that is lands on photodetector 634—which corresponds to the green filter—instead of the photodetector 632 associated with the red filter 622. As a result, the angled light beam 604 increases the charge produced by photodetector 634, which represents both the intensity of the green light incident on the photodetector 634 and the intensity of the angled red light beam 604.

FIG. 6B is a conceptual illustration 650 of reduced color cross-talk in a multi-lens imaging-based tactile sensor, according to an example embodiment. The light beams incident on the lenses 612 and 614 are of the same source and have the same angle as the light beams illustrated in conceptual illustration 600. Here, however, some of those beams are refracted by lens 614 while another beam is refracted by lens 612. In this example, the light beam 602 strikes the lens 614, which refracts the light beam 602 to form the angled light beam 606. Unlike the single-lens example shown in FIG. 6A, the angled light beam 606 does not bleed over to the adjacent pixel; instead, it passes through the green filter 624 and lands on the corresponding photodetector 634. The other three illustrated light beams similarly pass through their respective color filters and land on their corresponding photodetectors.

An array of smaller lenses (compared to a single larger lens) may therefore reduce or eliminate color cross-talk. Each lens more narrowly focuses incident light onto its corresponding portion of the image sensor, which may reduce the number of light beams that produce color cross-talk.

Conceptual illustrations 600 and 650 are provided for explanatory purposes and may or may not necessarily be drawn to scale. Additionally, the angles of refraction and placement of various components may differ from those shown in FIGS. 6A and 6B, depending upon the particular implementation.

VI. Example Configuration for Reduced Color Cross-Talk

Figure 7A:
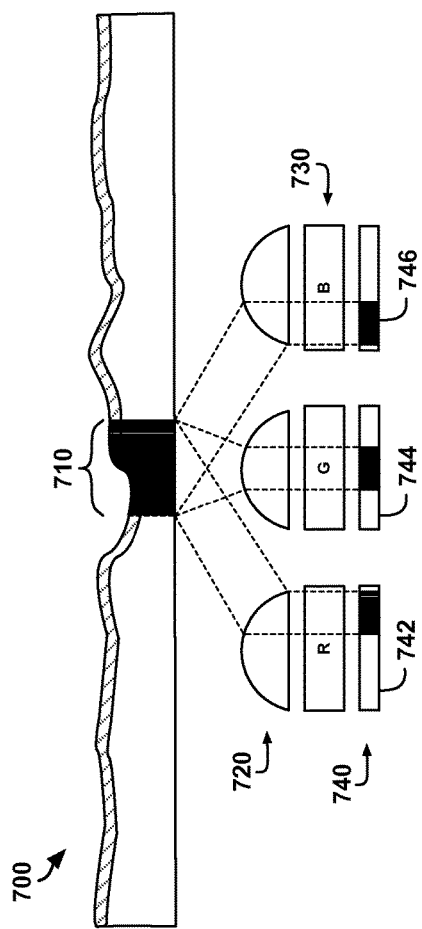
FIG. 7A illustrates a side view of a multi-lens imaging-based tactile sensor configuration, according to an example embodiment.

FIG. 7A illustrates a side view 700 of a multi-lens imaging-based tactile sensor configuration, according to an example embodiment. Here, the field-of-view for each lens in the array of lenses 720 overlaps, such that the section 710 of the elastic material is captured within three separate sub-images. Each lens directs light through a single color filter within the color filter array 730. The filtered light that passes through a given filter then illuminates a corresponding 3×3 photodetector group (or "sub-array"), such that photodetectors within a given group all correspond to the same color of light.

In this example, the left lens directs light through a red color filter (denoted by "R") of the color filter array 730 and onto the right side of the photodetector group 742 of the image sensor 740. The center lens direct light through a green color filter (denoted by "G") and onto the center portion of the photodetector group 744. The right lens direct light through a blue color filter (denoted by "B") onto the left side of the photodetector group 746. The portions of each photodetector group that are illuminated by filtered light corresponding to region 710 are illustrated in FIG. 7B.

Figure 7B:
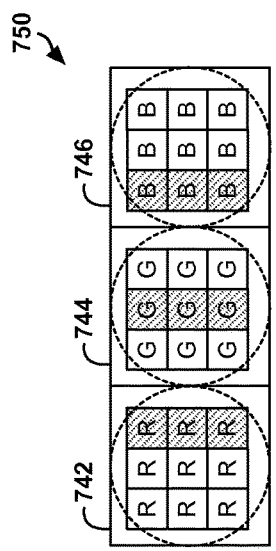
FIG. 7B illustrates a top-down view of an image sensor, according to an example embodiment.

FIG. 7B illustrates a top-down view 750 of the image sensor 740, according to an example embodiment. In the example illustrated in FIGS. 7A and 7B, the left lens directs light corresponding to region 710 onto the right column of photodetectors of photodetector group 742. The center lens directs light corresponding to region 710 onto the center column of photodetectors of photodetector group 744. The right lens directs light corresponding to region 710 onto the left column of photodetectors of photodetector group 746. As a result, light from region 710 is captured within three separate sub-images. Such overlap may be useful in generating a full color image of the reflective membrane.

More specifically, capturing a given region in three separate colors of light may be useful in determining depth information about the object pressed against the reflective membrane. In some embodiments, a multi-lens imaging-based tactile sensor may include a set of light sources—such as light-emitting diodes (LEDs)—positioned around the elastic material and pointed toward the reflective membrane from various positions and angles. If the positions, angles, and colors of the light sources are known, photometric stereo techniques may be performed on multiple color images in order to generate a depth map of the object impressed into the elastic material. In some instances, having separate red, green, and blue image data all mapped to the same region of the reflective membrane enables a computing device to perform accurate photometric stereo depth sensing.

Additionally, the configuration depicted in FIGS. 7A and 7B further reduce color cross-talk compared to the embodiments and configurations previously described. Because each photodetector within a 3×3 photodetector sub-array corresponds to a single color filter, no color cross-talk occurs among adjacent photodetectors within the photodetector sub-array. Thus, color cross-talk may only occur at the boundaries between adjacent photodetector sub-arrays. As illustrated in FIG. 7B, each 3×3 photodetector sub-array is surrounded by a non-photoactive material to increase the distance between adjacent photodetector sub-arrays. Thus, the configuration depicted in FIGS. 7A and 7B may be utilized in applications where color accuracy is very important.

One specific example implementation utilizing the operating principle illustrated in FIGS. 7A and 7B is an 8×8 lens array that directs light onto an 8×8 color filter array, which filters light onto a corresponding image sensor. The image sensor may include an 8×8 array of photodetector groups, with each photodetector group consisting of a 640×480 photodetector array (a VGA resolution). In this example, the collective resolution of the image sensor is 5,120×3,840—a total resolution of about 8.96 megapixels. The 8×8 color filter array may be a Bayer filter, with 16 groups of 2×2 RGGB color filter sub-arrays. Each 640×480 photodetector array may be separated from adjacent photodetector arrays by some amount using a non-photoactive material. The image sensor in this example is 8.5 cm by 8.5 cm. This specific example implementation may be referred to herein as the "multi-lens VGA implementation."

For the purposes of comparison, a single-lens implementation using one large lens and standard Bayer filter (an individual color filter for each photodetector) may include an 8-megapixel image sensor. This single-lens implementation may also have an image sensor that is 8.5 cm by 8.5 cm, and has a height from the top of the lens to the bottom of the image sensor of 8 centimeters.

By replacing the single lens with the 8×8 lens array of the multi-lens VGA implementation, the height of the overall image capture device can be reduced from 8 cm to 2.5 centimeters—less than a third of the height of the single-lens implementation. Note that this significant height reduction can be achieved using an array of 64 lenses; a micro-lens array may contain hundreds or thousands of lenses, which could lead to even further height reduction of the image capture device.

Additionally, by replacing the standard Bayer filter with a grouped 8×8 Bayer filter, color cross-talk may be considerably reduced. Whereas the single-lens implementation might experience color cross-talk between any of the 8 million photodetector boundaries, the multi-lens VGA implementation may only experience color cross-talk near the boundaries between any of the 64 photodetector arrays. Because each 640×480 photodetector array is configured to receive light of a single common color, over 300,000 photodetectors within that photodetector array may not experience any color cross-talk.

Note that this specific example is provided for explanatory purposes. The height reduction and color cross-talk benefits described above may vary, depending upon the implementation. The specific values referred to above may or may not necessarily correspond to a physical implementation of a multi-lens tactile sensor.

VII. Example Implementations

Figure 8:
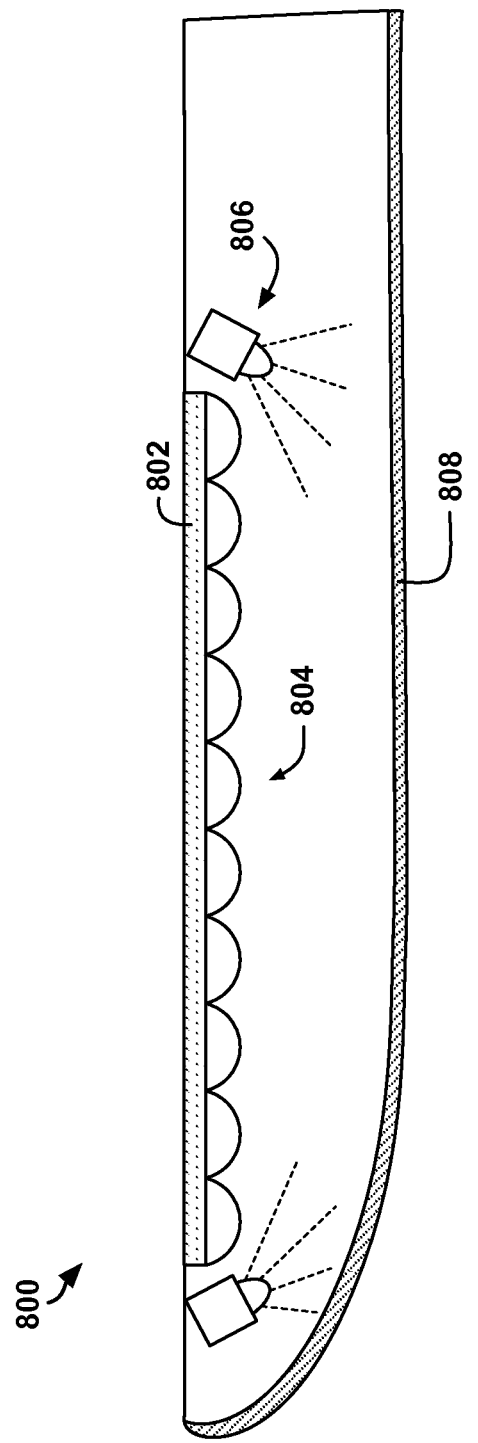
FIG. 8 illustrates a side view of a multi-lens imaging-based tactile sensor incorporated within a robotic finger, according to an example embodiment.

FIG. 8 illustrates a side view 800 of a multi-lens imaging-based tactile sensor incorporated within a robotic finger, according to an example embodiment. The robotic finger includes a reflective elastic material 808 that is flexible and may conform to the shape of objects or surfaces pressed thereon. The side of the reflective elastic material 808 facing the array of lenses 804 may be illuminated by light sources 806. The light sources 806 may emit light toward the surface of the reflective elastic material, some of which reflects off the elastic material toward the array of lenses 804. The array of lenses direct light onto various regions of the image sensor 802, which generates an image of the shape impressed into the reflective elastic material by an object.

The robotic finger illustrated in FIG. 8 may be incorporated within a robotic system. For example, the robotic system may include a robotic manipulator made of a number of components of actuators, enabling the robotic system to interact with objects within the environment. The robotic manipulator may include a robotic arm and an end effector attached thereto. The end effector may be any device designed to interact with the environment. An example end effector may be a gripping device including two or more robotic fingers that, when pressed together, enable the end effector to grip an object. In these instances, one or more of the robotic fingers may include the multi-lens imaging-based tactile sensors of the present application.

A robotic control system may receive information about a gripped object's surface features, size, and/or orientation and instruct the end effector to perform a task based on the that information. An end effector may compare a gripped object's features to a stored model of that object in order to determine its relative orientation within the end effector. The robotic control system may then rotate or move the end effector by some amount to accomplish a task based on the known orientation and position of the object within the end effector. For example, the robotic control system may instruct an end effector to insert an electronic connector into a socket; in this example, the relative orientation and position of the connector within the end effector's grip is necessary in order to accurately place the connector within the socket.

Note that a robotic finger implementation is one example application of the multi-lens tactile sensing techniques of the present application. The robotic finger depicted in FIG. 8 is provided for explanatory purposes to show how such multi-lens tactile sensors may be incorporated within a robotic finger. The tactile sensors of the present application may be incorporated within other devices, apparatuses, and/or robotic appendages other than those explicitly contemplated herein.

VIII. Conclusion

It should be understood that arrangements described herein are for purposes of example only. As such, those skilled in the art will appreciate that other arrangements and other elements (e.g. machines, interfaces, operations, orders, and groupings of operations, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. It is also to be understood that the terminology used herein is for the purpose of describing particular implementations only, and is not intended to be limiting.

What is claimed is:

1. A device comprising:
   an elastic material comprising a reflective membrane, wherein the reflective membrane conforms to a shape of an object pressed against the elastic material;
   two or more light sources situated at known positions proximate to the reflective membrane, wherein each light source of the one or more light sources is configured to illuminate at least a portion of the reflective membrane by emitting a corresponding color of light;
   an image capture device configured to capture at least one image of the reflective membrane, wherein the image capture device comprises:
     an image sensor configured to generate the at least one image based on light incident on the image sensor, wherein the image sensor comprises a plurality of photodetector groups separated by non-photoactive material, and wherein each photodetector group comprises a plurality of adjacent photodetectors arranged in a grid;
     a plurality of lenses configured to direct light onto the image sensor, wherein each lens of the plurality of lenses is configured to direct light onto a corresponding photodetector group of the plurality of photodetector groups, and wherein the plurality of lenses is arranged in a planar array situated directly between the elastic material and the image sensor such that the plurality of lenses is separated from the elastic material by free space; and
     a color filter array situated between the plurality of lenses and the image sensor, wherein the color filter array comprises a plurality of color filters corresponding to the colors of light emitted by the two or more light sources, wherein each respective color filter of the color filter array is configured to pass light of a given color onto a corresponding photodetector group of the plurality of photodetector groups such that each photodetector group has incident thereon light of a single color, and
   wherein the at least one image of the reflective membrane comprises two or more simultaneously-captured sub-images corresponding to the colors of light emitted by the two or more light sources, wherein a given sub-image of the two or more sub-images represents the reflective membrane illuminated by a single color of light; and
   processing hardware configured to generate a depth map of the reflective membrane based on the two or more sub-images corresponding to the colors of light emitted by the two or more light sources by way of one or more photometric stereo techniques.

2. The device of claim 1, further comprising processing hardware configured to generate an estimate of forces acting on the reflective membrane based on an extent of deformation of the reflective membrane.

3. The device of claim 1, wherein the plurality of photodetector groups are arranged in a planar array.

4. The device of claim 1, wherein each lens of the plurality of lenses is configured to direct light onto one or more corresponding photodetectors of the plurality of adjacent photodetectors arranged in the grid.

5. The device of claim 1, wherein each lens of the plurality of lenses is configured to direct light onto a corresponding color filter of the color filter array.

6. The device of claim 1, wherein each light source of the two or more light sources is configured to emit light toward the reflective membrane from a different angle.

7. The device of claim 1, wherein each light source of the two or more light sources is configured to emit a different color of light.

8. The device of claim 1, wherein each lens of the plurality of lenses is configured to direct light reflected from a section of the reflective membrane onto the corresponding photodetector group, and wherein the two or more sub-images correspond to the sections of the reflective membrane.

9. The device of claim 8, wherein a field-of-view of a given sub-image of the two or more sub-images overlaps with a field-of-view of a different sub-image of the two or more sub-images.

10. The device of claim 1, wherein the elastic material further comprises a transparent volume situated between the reflective membrane and the image capture device.

11. A tactile sensor comprising:
an elastic material comprising a reflective membrane, wherein the reflective membrane conforms to a shape of an object pressed against the elastic material;
a plurality of light sources situated at known positions proximate to the reflective membrane, wherein each light source of the plurality of light sources is configured to illuminate at least a portion of the reflective membrane by emitting a corresponding color of light;
an image capture device configured to capture at least one image of the reflective membrane, wherein the image capture device comprises:
an image sensor configured to generate a plurality of sub-images based on light incident on the image sensor, wherein the image sensor comprises a plurality of photodetector groups separated by non-photoactive material, and wherein each photodetector group comprises a plurality of adjacent photodetectors arranged in a grid;
a plurality of lenses configured to direct light onto the image sensor, wherein each lens of the plurality of lenses is configured to direct light onto a corresponding photodetector group of the plurality of photodetector groups to generate a corresponding sub-image of the plurality of sub-images, and wherein the plurality of lenses is arranged in a planar array situated directly between the elastic material and the image sensor such that the plurality of lenses is separated from the elastic material by free space; and
a color filter array situated between the plurality of lenses and the image sensor, wherein the color filter array comprises a plurality of color filters corresponding to the colors of light emitted by the plurality of light sources, wherein each respective color filter of the color filter array is configured to pass light of a given color onto a corresponding photodetector group of the plurality of photodetector groups such that each photodetector group has incident thereon light of a single color, and
wherein the plurality of sub-images correspond to the colors of light emitted by the plurality of light sources, and wherein each sub-image of the plurality of sub-images represents the reflective membrane illuminated by a single color of light; and
processing hardware configured to generate a depth map of the reflective membrane based on the plurality of sub-images by way of one or more photometric stereo techniques.

12. A robotic system comprising:
a robotic manipulator comprising an end effector; and
a tactile sensor coupled to the end effector, wherein the tactile sensor comprises:
an elastic material comprising a reflective membrane, wherein the reflective membrane conforms to a shape of an object pressed against the elastic material;
two or more light sources situated at known positions proximate to the reflective membrane, wherein each light source of the one or more light sources is configured to illuminate at least a portion of the reflective membrane by emitting a corresponding color of light; and
an image capture device configured to capture at least one image of the reflective membrane, wherein the image capture device comprises:
an image sensor configured to generate the at least one image based on light incident on the image sensor, wherein the image sensor comprises a plurality of photodetector groups separated by non-photoactive material, and wherein each photodetector group comprises a plurality of adjacent photodetectors arranged in a grid;
a plurality of lenses configured to direct light onto the image sensor, wherein each lens of the plurality of lenses is configured to direct light onto a corresponding photodetector group of the plurality of photodetector groups, and wherein the plurality of lenses is arranged in a planar array situated directly between the elastic material and the image sensor such that the plurality of lenses is separated from the elastic material by free space; and
a color filter array situated between the plurality of lenses and the image sensor, wherein the color filter array comprises a plurality of color filters corresponding to the colors of light emitted by the two or more light sources, wherein each respective color filter of the color filter array is configured to pass light of a given color onto a corresponding photodetector group of the plurality of photodetector groups such that each photodetector group has incident thereon light of a single color, and
wherein the at least one image of the reflective membrane comprises two or more simultaneously-captured sub-images corresponding to the colors of light emitted by the two or more light sources, wherein a given sub-image of the two or more sub-images represents the reflective membrane illuminated by a single color of light; and
processing hardware configured to generate a depth map of the reflective membrane based on the two or more sub-images corresponding to the colors of light emitted by the two or more light sources by way of one or more photometric stereo techniques.

13. The device of claim 1, wherein each lens of the plurality of lenses has a planar side and a convex side, and wherein the planar side faces the image sensor and the convex side faces the elastic material.

14. The tactile sensor of claim 11, further comprising processing hardware configured to generate an estimate of forces acting on the reflective membrane based on an extent of deformation of the reflective membrane.

15. The tactile sensor of claim 11, wherein the plurality of photodetector groups are arranged in a planar array.

16. The tactile sensor of claim 11, wherein each lens of the plurality of lenses is configured to direct light onto one or more corresponding photodetectors of the plurality of adjacent photodetectors arranged in the grid.

17. The tactile sensor of claim 11, wherein each light source of the plurality of light sources is configured to emit light toward the reflective membrane from a different angle.

18. The tactile sensor of claim 11, wherein each light source of the plurality of light sources is configured to emit a different color of light.

19. The tactile sensor of claim 11, wherein each lens of the plurality of lenses is configured to direct light reflected from a section of the reflective membrane onto the corresponding photodetector group, and wherein the plurality of sub-images correspond to the sections of the reflective membrane.

20. The tactile sensor of claim 11, wherein a field-of-view of a given sub-image of the plurality of sub-images overlaps with a field-of-view of a different sub-image of the plurality of sub-images.

* * * * *